United States Patent [19]

Masaki et al.

[11] Patent Number: 4,792,671
[45] Date of Patent: Dec. 20, 1988

[54] PHOTOSENSOR ARRAY HAVING GROUPED ELECTRODES

[75] Inventors: Yuichi Masaki, Kawasaki; Seiji Kakimoto, Yokohama; Katsunori Terada, Tokyo; Nobuyuki Sekimura, Kawasaki, all of Japan

[73] Assignee: Canon Kabushiki Kaisha, Tokyo, Japan

[21] Appl. No.: 93,149

[22] Filed: Sep. 2, 1987

Related U.S. Application Data

[63] Continuation of Ser. No. 717,795, Mar. 29, 1985.

[30] Foreign Application Priority Data

Apr. 16, 1984 [JP] Japan .................................. 59-74909

[51] Int. Cl.$^4$ ............................................. H01J 40/14
[52] U.S. Cl. .................................. 250/211 R; 250/578
[58] Field of Search ................. 357/31, 32; 250/211 J, 250/211 R, 578

[56] References Cited

U.S. PATENT DOCUMENTS

| | | | |
|---|---|---|---|
| 4,247,874 | 1/1981 | Kos et al. | 250/211 J |
| 4,288,702 | 9/1981 | Ozawa et al. | 250/211 J |
| 4,419,696 | 12/1983 | Hamano et al. | 250/211 J |
| 4,461,956 | 7/1984 | Hatanaka et al. | 357/32 |

FOREIGN PATENT DOCUMENTS

0102990  8/1979  Japan .................................. 357/32

Primary Examiner—David C. Nelms
Attorney, Agent, or Firm—Fitzpatrick, Cella, Harper & Scinto

[57] ABSTRACT

A photosensor array includes a plurality of common electrodes and a plurality of separate electrodes disposed facing the common electrodes, both electrodes being disposed on a substrate, wherein the electrical connection terminals for the common electrodes are disposed collectively on a marginal portion along the array disposal direction on the substrate.

2 Claims, 2 Drawing Sheets

PHOTOSENSOR ARRAY HAVING GROUPED ELECTRODES

This application is a continuation of application Ser. No. 717,795 filed Mar. 29, 1985.

BACKGROUND OF THE INVENTION

1. Field of the Invention

The present invention relates to a photosensor array for use in retrieval of a light signal in a photoelectric conversion device which is used as a read-out section of an image information processing apparatus.

2. Description of the Prior Art

Conventionally, a linear photodiode type elongated photosensor array made of silicon monocrystal has been used in a photoelectric conversion device which is used as a read-out section of an image processing apparatus, such as facsimile, and digital copier. The photosensor array of this type, however, has been restricted in its length in view of the available dimensions and precisions with which silicon monocrystals can be manufactured. For this reason, in the case of a wide original to be read out, an original image has been focused as a scaled-down image onto a photosensor array using an appropriate optical system. However, the introduction of such a scaling-down optical system results in a disadvantage in miniaturizing the read-out section.

Apart from the above, by virtue of development of film forming methods, such as glow discharge method, sputtering method, ion plating method, and vaccum evaporation method, or a method for coating a mixture of binding resin and semiconductor material, an elongated and large dimension photosensor array has been realized by using such technology.

A planar type photoconductive photosensor may be given as one example of photosensors constituting such an elongated line sensor, in which a pair of metal electrodes are formed on a photoconductive layer, such as amorphous silicon, chalcogenide, CdSor, CdS-Se, the pair of metal electrodes being disposed on the photoconductive layer facing each other so as to form a gap serving as a photoelectric conversion portion.

FIG. 1 is a brief partial plan view showing one example of such planar type photosensor arrays, and FIG. 2 is a cross sectional view along a line II—II of FIG. 1. In the figures, numeral 1 represents a substrate, numeral 2 is an amorphous silicon photoconductive layer mounted on the substrate, numeral 3 represents a common electrode, and numeral 4 represents a separate electrode. A gap portion at which each separate electrode 4 faces the common electrode 3 is a photoelectric conversion portion (i.e., pixel). In the figures, the pixels, are disposed in a $7 \times 5 (=35)$ array. The pixels are divided into seven blocks, each block including five pixels. The common electrodes 3 are respectively provided one for each block. The separate electrodes 4 are provided, at the opposite side of the photoelectric conversion portion, with an insulation layer 5. The insulation layer 5 is formed with a through hole 6 through which each separate electrode 4 of the block is connected to the corresponding one of five signal pick-up wires 7 mounted on the insulation layer 5. Therefore, the photosensor array can be driven in a matrix fashion by connecting to a driver circuit the seven terminals for the common electrodes 3 and five pick-up terminals for the pick-up wires 7.

Although the photosensor array with thirty-five pixels has been described with reference to FIGS. 1 and 2, in the case of an elongated photosensor array of a high density of pixels, the number of pixels may be $64 \times 32 = 2048$ for example. FIG. 3 shows an equivalent circuit diagram of such a photosensor array. In FIG. 3 $C_1$ to $C_{64}$ represent 64 common electrode terminals, $I_1$ to $I_{32}$ represent 32 signal pick-up wire terminals for the separate electrodes, and $R_1$ to $R_{2048}$ represent 2048 photoelecrric conversion portions. With the photosensor array as above, it is possible to derive outputs by sequentially applying voltages to the common electrode terminals $C_1$ to $C_{64}$ and sequentially driving the signal pick-up wire terminals $I_1$ to $I_{32}$ for the separate electrodes. The terminals $C_1$ to $C_{64}$ and $I_1$ to $I_{32}$ of the photosensor array are connected to a driver circuit. In this case, according to the conventional photosensor array, the terminal arrangement similar to that shown in FIG. 1 has been adopted heretofore. That is, as shown in the brief plan view of FIG. 4, the terminals $C_1$ to $C_{64}$ and $I_1$ to $I_{32}$ have been disposed along the marginal portion of the substrate in the direction of the array disposal in the photosensor array.

With the photosensor array constructed as above, it is required to make the pitch of mutual arrangement particularly of the common electrode terminals $C_1$ to $C_{64}$. The reason is that if a large pitch of arrangement is used, the area for wiring the common terminals 3 on the substrate 1 becomes very large and it is not possible to realize a compact photosensor array. In addition, generally the connections of the driver circuit to the terminals $C_1$ to $C_{64}$ and $I_1$ to $I_{32}$ are attained using a flexible wiring board so that if the terminal pitch is made too narrow, the connection work becomes hard to carry out. Thus, disadvantages arise such as the increase of the number of processes required in manufacture, and a lower yield.

SUMMARY OF THE INVENTION

In view of the above prior art, it is an object of the present invention to provide a photosensor array which is compact and is advantageously arranged to facilitate the work of connection to the driver circuit.

The object of the present invention is attained by providing a photosensor array comprising a plurality of common electrodes and a plurality of separate electrodes disposed facing the common electrodes, both electrodes being disposed on a substrate, wherein the electrical connection terminals for the common electrodes are disposed collectively on a marginal portion along the array disposal direction on the substrate.

DETAILED DESCRIPTION OF THE PREFERRED EMBODIMENT

The preferred embodiment of the present invention will now be described with reference to the accompanying drawings.

Figure 1:
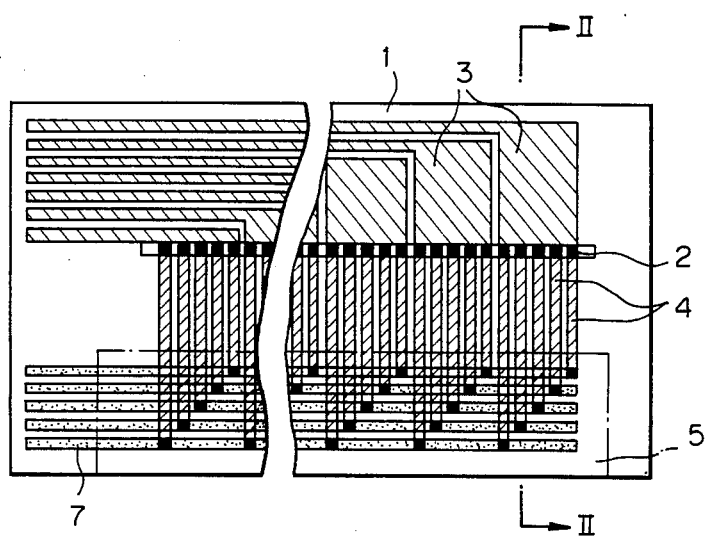
FIG. 1 is a partial plan view of a prior art photosensor array.
Figure 2:
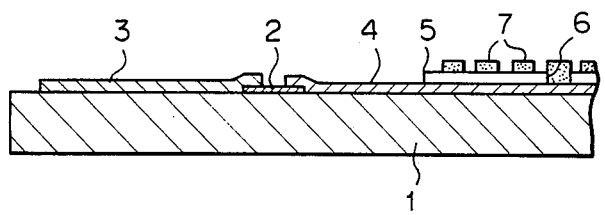
FIG. 2 is a cross section along the line II—II of FIG. 1.
Figure 3:
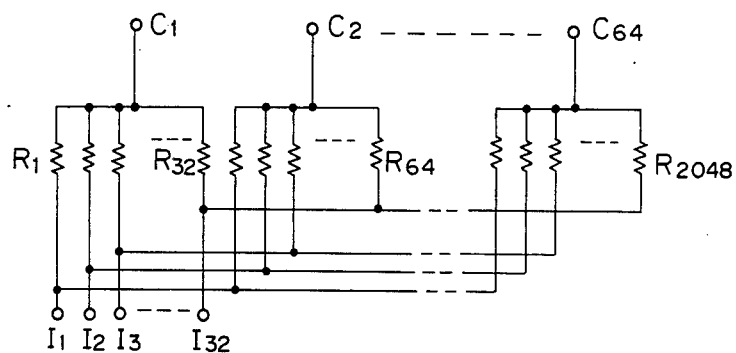
FIG. 3 is a equivalent circuit diagram of a photosensor array.
Figure 4:
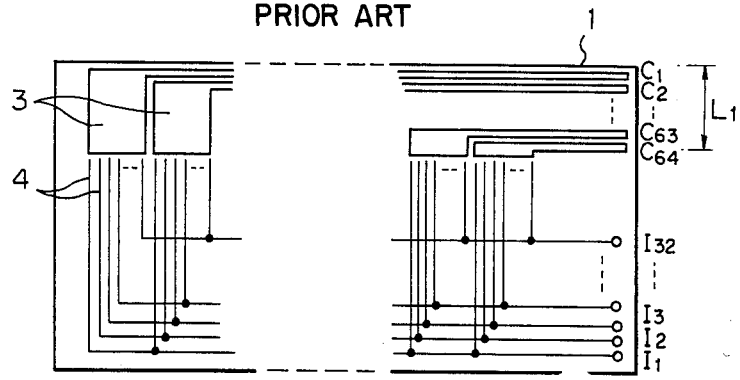
FIG. 4 is a partial plan view of a prior art photosensor array.
Figure 5:
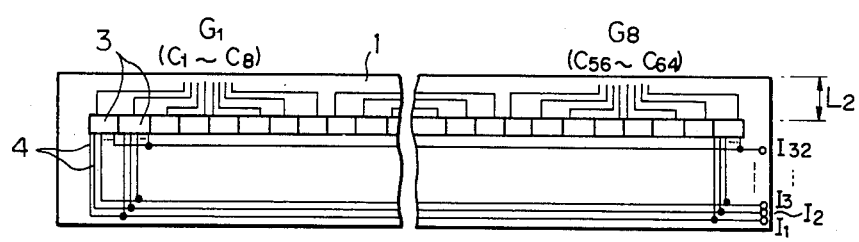
FIG. 5 is a partial plan view of a photosensor array according to the present invention.

FIG. 5 is a plan view briefly showing the preferred embodiment of photosensor array according to the present invention. In that figure, numeral 1 represents a substrate, numeral 3 represents a common electrode, and numeral 4 represents separate electrodes. In the present embodiment, the number of pixels is 2048, which is identical to that with FIG. 4. The pixels, although they are not shown in the figure, are disposed in a line between the common electrodes 3 and the separate electrodes 4 along the direction of disposal of these electrodes $C_1$ to $C_{64}$ and $I_1$ to $I_{32}$ represent common electrode terminals and separate electrode terminals for picking up signals in a matrix fashion, respectively. In the present embodiment, the common electrode terminals are divided into eight groups $G_1$ to $G_8$ and are disposed collectively on eight marginal portions along the direction of array disposal on the substrate 1.

The comparison between the present embodiment and the conventional example of FIG. 4 is as follows. Assuming that the pitch of disposal of the common electrode terminals is 1 mm, which satisfactorily facilitates the work of connection to the driver circuit, the width $L_1$ required for the wiring of the common electrodes on the substrate 1 in FIG. 4 is about 64 mm. In contrast, about 5 mm is sufficient for the width $L_2$, required for the wiring of the common electrodes in the present embodiment. If the width $L_1$ were set to 5 mm for FIG. 4, then the disposal density of the terminals would become 13 terminals/mm, which means that the connection is impossible in practice.

In the present embodiment, the connection between the common electrode terminals and the driver circuit can be carried out properly and effectively with a heat seal connector while the operator looks at the connection conditions so as to align the positions of the electrode terminals.

As will be appreciated from the above description of the present invention, it is possible to provide a photosensor array which presents a good performance of a connection work to the driver circuit and is compact in dimension.

What we claim is:

1. A photosensor array comprising a substrate, a plurality of common electrodes and a plurality of separate electrodes disposed facing said common electrodes, said common electrodes and said separate electrodes being disposed on said substrate, wherein said common electrodes have respective electrical connection terminals disposed in spaced groups on a marginal portion of said substrate, the spacing between respective connection terminals in a group being smaller than the spacing between respective groups, said groups being arranged so as to define a row along said marginal portion.

2. A photosensor array according to claim 1, wherein said separate electrodes are connected in a plurality of blocks for organizing said separate electrodes into a matrix, each block corresponding to respective groups of common electrodes.

* * * * *